(12) United States Patent
Wesseling et al.

(10) Patent No.: US 6,324,752 B1
(45) Date of Patent: Dec. 4, 2001

(54) COMPONENT PLACEMENT MACHINE

(75) Inventors: Wessel J. Wesseling; Gerardus L. J. Reuvers, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/571,670

(22) Filed: May 15, 2000

(30) Foreign Application Priority Data

Nov. 5, 1999 (EP) .................................................. 99203679

(51) Int. Cl.⁷ ...................................................... H05K 3/30
(52) U.S. Cl. ................................ 29/740; 29/743; 29/832; 29/564
(58) Field of Search .............................. 29/740, 833, 832, 29/827, 564, 743, 786, 793; 198/689.1, 803.15, 844.2, 341

(56) References Cited

U.S. PATENT DOCUMENTS

| Re. 29,206 | * | 5/1977 | Jaffa | 101/407 R |
|---|---|---|---|---|
| 3,638,564 | * | 2/1972 | Prange et al. | 101/35 |
| 4,631,812 | * | 12/1986 | Young | 29/714 |
| 5,259,496 | * | 11/1993 | Common | 198/803.15 |
| 5,553,536 | * | 9/1996 | Van Os | 101/44 |
| 5,680,699 | | 10/1997 | Vos | 29/833 |
| 5,692,292 | * | 12/1997 | Asai et al. | 29/740 |
| 5,902,201 | * | 5/1999 | Vermeer et al. | 474/109 |

* cited by examiner

*Primary Examiner*—Lee Young
*Assistant Examiner*—Minh Trinh
(74) *Attorney, Agent, or Firm*—Steven R. Biren

(57) ABSTRACT

Component placement machine with a frame (1) and a transport device (2) for transporting printed circuit boards (3) in an X-direction, which transport device is provided with a transport belt (9) having an outer surface (13) on which printed circuit boards (3) are positioned. During the transport of printed circuit boards (3) as well as during the placement of components (6) on the printed circuit boards (3) an edge portion (12) of the printed circuit board which extends in the X-direction is retained between the outer surface (13) of the transport belt (9) and a contact surface (11) of the frame (1). The outer surface (13) of the transport belt has a relatively high coefficient of friction in contact with said edge portion (12) of the printed circuit board, whereas said contact surface (11) of the frame has a relatively low coefficient of friction in contact with said edge portion (12) of the printed circuit board.

7 Claims, 2 Drawing Sheets

COMPONENT PLACEMENT MACHINE

BACKGROUND OF THE INVENTION

The invention relates to a component placement machine with a frame and a transport device for transporting printed circuit boards in an X-direction, which transport device comprises a transport beam which extends in the X-direction and is capable of being driven in a reciprocating movement in the X-direction.

Such a placement machine is known from U.S. Pat. No. 5,680,699. The transport beam in this machine is provided with transport pins and positioning pins for the printed circuit boards. Said pins are present in openings of the printed circuit boards. The transport beam transports the printed circuit boards in an indexed manner in the positive X-direction, i.e. the transport beam with the printed circuit boards makes an intermittent movement each time over a predetermined distance which corresponds to a given position of the printed circuit board with respect to a placement head. Such a movement is necessary for bringing the printed circuit board in a desired position below the placement head so as to enable a placement of the components in the correct positions by means of the placement head. After a number of intermittent movements, the transport beam will be at the end of its stroke and is to be returned to its starting position. The pins are removed from the holes of the printed circuit boards in that the entire transport beam is moved down, i.e. in a Z-direction perpendicular to the X-direction, whereupon the transport beam is returned to its starting position in the negative X-direction. A new printed circuit board may then be placed on the transport beam and the printed circuit board at the other end can be removed from the row present on the transport beam. In view of the high accuracy with which components must be placed, and taking into account that the dimensions of the components themselves and the interspacings between the components on the printed circuit boards become smaller and smaller, it is necessary for the above movements to be carried out with a very high accuracy. A disadvantage of this manner of transport is that the tooling set present in the machine for the positioning and transport pins must be replaced by a different tooling set whenever a different type of printed circuit board is to be provided with components. In addition, a renewed calibration must take place. All this takes much time.

SUMMARY OF THE INVENTION

It is an object of the invention to avoid the disadvantage mentioned above.

The component placement machine as described in the opening paragraph is for this purpose characterized in that the transport device is provided with a transport belt which is at least partly supported by the transport beam, which is displaceable in the X-direction by means of the transport beam, and which has an outer surface on which printed circuit boards lie during operation, in that the frame is provided with a contact surface which extends in the X-direction such that an edge portion of the printed circuit board extending in the X-direction lies enclosed between the outer surface of the transport belt and the contact surface of the frame both during transport of the printed circuit board and during the placement of components on the printed circuit board, and in that said outer surface of the transport belt has a comparatively high friction coefficient with respect to the edge portion of the printed circuit board, while said contact surface of the frame has a comparatively low friction coefficient with respect to the edge portion of the printed circuit board. The combination of the comparatively high friction between the edge portion of the printed circuit board and the outer surface of the transport belt on the one hand and the comparatively low friction between the edge portion of the printed circuit board and the contact surface of the frame on the other hand ensures that the printed circuit board retains its position on the transport belt both during the placement of components on the printed circuit board and during transport of the printed circuit board, while the edge portion can easily slide along the contact surface of the frame during transport of the printed circuit board. Transporting and positioning pins are no longer necessary. The conversion of the machine to other types of printed circuit boards, such as an adaptation of the transport beam to the width of the printed circuit board, can take place in a simple manner and very fast. A renewed calibration is not necessary.

In practice, two mutually opposed edge portions of a printed circuit board can be supported and transported in the manner described above. In other words, the construction is a two-sided one. It is also possible for only one edge portion of the printed circuit board to be supported and transported in the manner described above, while the edge portion on the other side of the printed circuit board is exclusively supported by a support beam.

A preferred embodiment of the placement machine is characterized in that the contact surface of the frame is a surface of a pressure beam which is movable relative to the frame in the direction of the transport belt, and in that means are present for moving the pressure beam to the transport belt so as to press the contact surface with pre-stress against the edge portion of the printed circuit board. The force with which the edge portion of the printed circuit board is retained between the contact surface and the outer surface of the transport belt can be set for a desired value with these pressure means.

Preferably, said means comprise an inflatable air hose. The air pressure in the air hose can be controlled in a simple manner. The additional use of resilient means, such as a blade spring, also leads to an even force and an increase in the stiffness of the pressure beam.

A further embodiment of the placement machine is characterized in that the frame is provided with a clamping mechanism for preventing that portion of the transport belt on which the printed circuit boards will lie from moving relative to the frame. The transport of the printed circuit boards is obtained through a movement of the transport beam in the negative X-direction followed by a movement in the positive X-direction. It is possible in a comparatively simple manner by means of a clamping mechanism to block the transport belt during one of these movements.

An embodiment of the clamping mechanism is characterized in that the clamping mechanism comprises two clamping jaws and means for moving said clamping jaws with respect to one another for the purpose of clamping the transport belt between the clamping jaws or releasing the transport belt. The means for moving the clamping jaws relative to one another preferably comprise an inflatable air hose. The clamping force can be set for the desired value by means of this hose in a simple manner.

In a further embodiment, the transport beam is provided with air supply means for creating an air bearing between the transport beam and the transport belt while the transport belt is being clamped by the clamping mechanism and the transport beam is being displaced in the X-direction. The friction between the transport beam and the transport belt is eliminated thereby, or at least rendered as small as possible.

A yet further embodiment is characterized in that an inlet and an outlet device are present for feeding printed circuit boards onto the transport belt and removing printed circuit boards from the transport belt, which two devices each comprise a transport belt running over transport wheels, at least one transport wheel being movable in the X-direction under the influence of the reciprocating movement of the transport beam. The supply and delivery of printed circuit boards thus take place simultaneously and in a simple manner.

BRIEF DESCRIPTION OF THE DRAWING

The invention will now be explained in more detail with reference to an embodiment shown in a drawing, in which.

DESCRIPTION OF THE PREFERRED EMBODIMENTS

Figure 1:
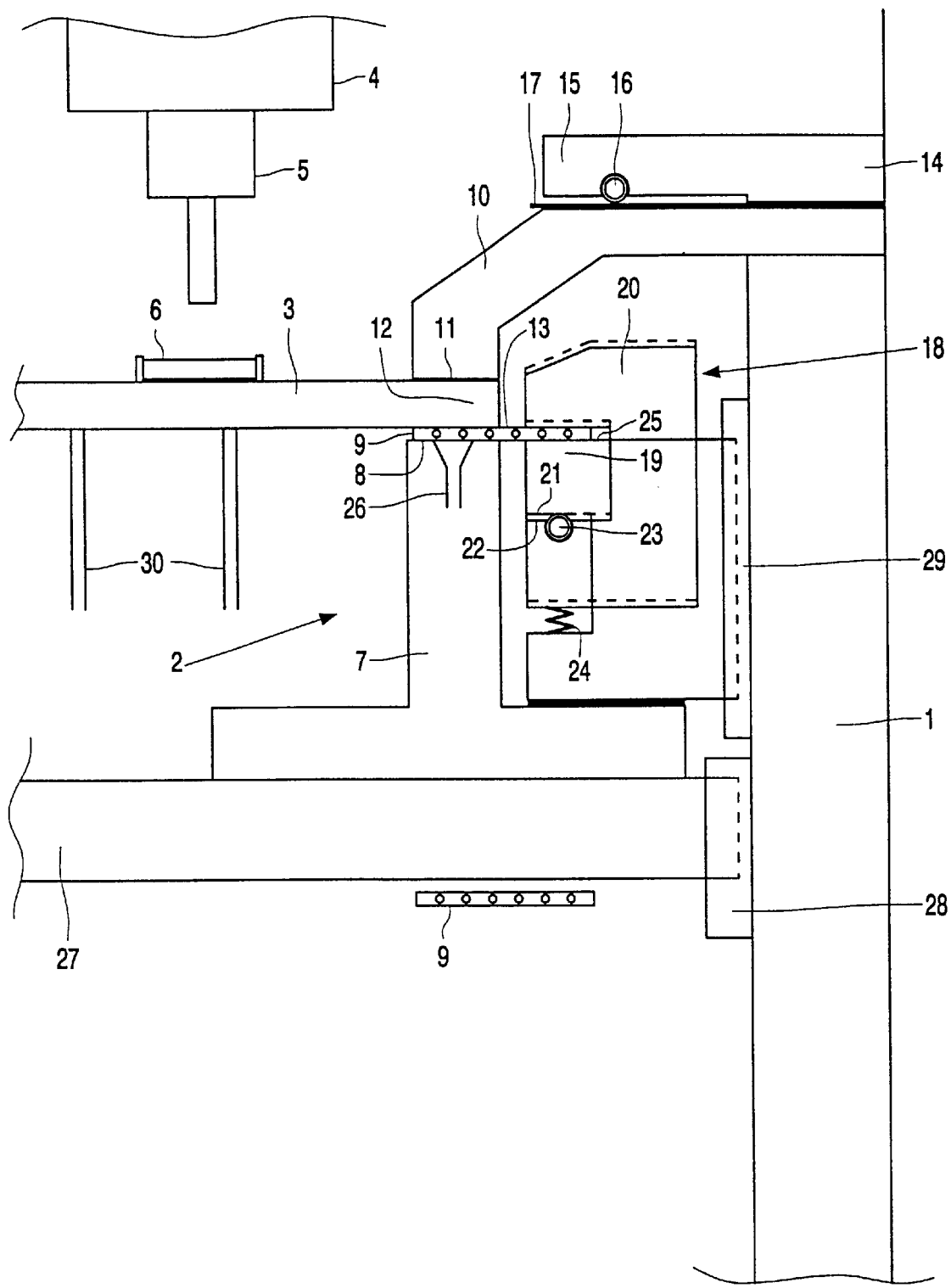
FIG. 1 is a diagrammatic cross-sectional view not true to scale of part of a component placement machine in a first embodiment.

The component placement machine of FIG. 1 has a frame 1 and a transport device 2 for transporting printed circuit boards 3 in the machine. Components 6 can be picked up from a feeder by means of a placement head 4, which is provided with a vacuum tube 5 or some other pick-up member, and be subsequently placed on a printed circuit board 3. The transport device 2 is provided with a transport beam 7 having a support surface 8 and with a transport belt 9 which lies partly on the support surface 8 of the transport beam 7. The frame 1 is provided with a pressure beam 10 having a contact surface 11. The contact surface 11 is at some distance above the support surface 8 of the transport beam 7. Printed circuit boards 3 which have been introduced into the machine, which will be explained in more detail with reference to FIGS. 2a–e, are guided with their edge portions 12 between the contact surface 11 of the pressure beam 10 and an outer surface 13 of the transport belt 9. FIG. 1 shows only half of the transporting and supporting device for the printed circuit board. In reality, two mutually opposed edge portions 12 of each printed circuit board are supported and enclosed by a transport beam 7 with transport belt 9 and pressure beam 10. The pressure beam 10 with its contact surface 11 is movable in the direction of the transport belt 9 such that the edge portion 12 of the printed circuit board 3 lies enclosed between the contact surface 11 and the outer surface 13 of the transport belt 9. The end 14 of the pressure beam is for this purpose clamped in the frame 1, such that the free end of the pressure beam 10, where the contact surface 11 is present, is movable. The movement range of the free end of the pressure beam need be small only, a few tenths of a millimeter are sufficient. An inflatable air hose 16 is present between a beam 15 which forms part of the frame 1 and the pressure beam 10. The outer diameter of the air hose can be made greater or smaller through a control of the air pressure in the air hose. When the pressure in the air hose increases, the air hose will press the pressure beam down, so that the force exerted by the contact surface on the edge portion 12 of the printed circuit board 3 will increase. It will be clear that the force with which the edge portion 12 of the printed circuit board is retained between the contact surface 11 of the pressure beam 10 and the outer surface 13 of the transport belt 9 is adjustable by means of the air pressure in the air hose 16. An additional resilient element, for example a blade spring 17, may be provided between the pressure beam 10 and the beam 15 of the frame so as to increase the stiffness of the pressure beam and to obtain a more even pressure on the edge portion of the printed circuit board. The transport beam can be driven in the X-direction for transporting the printed circuit boards in the machine, both in the positive (+X) and in the negative (−X) direction. As will be explained in more detail in the description of FIGS. 2a–e, the transport belt 9 is displaced in the positive X-direction simultaneously with the transport beam 7 over the same distance when this transport beam 7 is displaced in the positive X-direction, whereas a displacement of the transport beam 7 in the negative X-direction is accompanied by a locking of the transport belt 9 with respect to the frame 1. The placement of components on a printed circuit board must take place with very high accuracy. It is of major importance here that the printed circuit boards, once supplied on the transport belts, keep their position on the transport belts, both during transport in the machine and during the placement of components or any other operations, such as monitoring of the location of the printed circuit board by means of a camera, i.e. the printed circuit board must be immovable with respect to the transport belt as long as they are present on the transport belt. According to the invention, this is rendered possible in that on the one hand the outer surface 13 of the transport belt 9 has a comparatively high friction coefficient with respect to the surface of the edge portion 12 of the printed circuit board 3 making contact with the outer surface, while on the other hand the contact surface 11 of the pressure beam 10 has a comparatively low friction coefficient with respect to the surface of the edge portion 12 of the printed circuit board making contact with the contact surface 11. The result of this is that the printed circuit boards can glide smoothly along the contact surface 11 during transport in the X-direction while lying immovably on the transport belt. The value of the force with which the edge portion 12 of the printed circuit board lies enclosed between the transport belt 9 and the pressure beam 10 can be determined in a simple manner. It is obvious that this force is partly dependent on the friction coefficient of the edge portion of the printed circuit board. Printed circuit boards of different types will have different roughness values. The friction coefficient of the outer surface 13 of the transport belt 9 should preferably lie between 0.5 and 1.0. A material which may be used for the transport belt is polyurethane. The friction coefficient of the contact surface 12 should preferably lie between 0.1 and 0.25. A material which may be used is, for example, a synthetic resin such as ultra high molecular weight polyethylene (UHMWPE). It is possible to manufacture the entire pressure beam 10 from this material, so that it will be somewhat resilient.

As was noted above, the transport belt 9 is retained with respect to the frame 1 upon a displacement of the transport beam 7 in the negative X-direction. The machine is for this purpose provided with a clamping mechanism 18 comprising two mutually movable clamping jaws 19 and 20. The clamping jaw 19 is connected to the frame and is immovable at least in the X-direction and is referred to as the stationary clamping jaw 19 below. The clamping jaw 20 is accordingly referred to as the movable clamping jaw. A portion of the transport belt 9 can be clamped between the clamping jaws 19, 20. For this purpose, an air hose 23 is arranged between a surface 21 of the stationary clamping jaw 19 and a surface 22 of the movable clamping jaw 20. This air hose is entirely comparable to the air hose 16 present between the frame beam 15 and the pressure beam 10. When the air pressure in the air hose 23 is increased, the air hose will expand (its diameter increases), thus pressing the movable clamping jaw 20 downward so that the transport belt is clamped between the clamping jaws. When the air pressure is reduced, however, the air hose will shrink (its diameter becomes smaller) and the movable clamping jaw will be pressed upward (indicated with a broken line) under the influence of a spring 24 mounted between the clamping jaws. The transport belt is then released. The surface 25 of the stationary clamping jaw 19 obviously lies flush with the support surface 8 of the transport beam 7.

When the transport belt 9 is retained with respect to the frame and the transport beam 7 is being displaced in the negative X-direction, the support surface 8 of the transport beam should be capable of sliding smoothly underneath the transport belt. The transport beam is provided with air supply means 26 with which an air bearing is obtained between the transport belt 9 and the support surface 8 so as to reduce the resistance.

Printed circuit boards do not all have the same thickness. A carrier beam 27 on which the transport beams 7 are fastened is vertically adjustable with reference to the frame 1 so as to enable the use of the placement machine for printed circuit boards of different thicknesses. The frame is for this purpose provided with a guide 28 along which the carrier beam can slide in vertical direction, and with means (not shown) for fixing the carrier beam relative to the frame in the desired position. The clamping mechanism 8 must move along with the carrier beam 27 in its vertical adjustment. The clamping mechanism is for this purpose movable along a guide 29 of the frame 1.

As is usual, the printed circuit boards 3 are also supported by a bed of pins, represented by support pins 30 in the drawing.

FIGS. 2a–e represent the cycle in which printed circuit boards are transported in the machine as well as the inlet and outlet (or run-in and run-out) mechanisms for the printed circuit boards. An inlet device 40 is to the left of the transport beam 7 and an outlet device 41 to the right thereof in the Figures. The inlet device 40 and the outlet device 41 are substantially identical. The inlet device 40 is formed by a transport belt 42 which runs over transport wheels 44a–e. The transport wheels 44a–c are not movable relative to the frame of the placement machine. The transport wheels 44d–e are connected to the transport beam 7 and are thus displaceable relative to the frame in the X-direction. The connection is diagrammatically indicated with rods 46, 47. The transport belt 42 can be driven by a motor 52. Similarly, the outlet device 41 is provided with a transport belt 43, transport wheels 45a–e, rods 48, 49, and a motor 53. Printed circuit boards are supplied to the transport belt 42 of the inlet device 40 by a feeder belt 54 and are discharged from the transport belt 43 of the outlet device 41 to a delivery belt 55. The machine is further provided with an abutment 56 by means of which a printed circuit board 3 to be newly provided on the transport belt 42 of the inlet device 40 can be stopped and positioned before it is brought onto the transport belt 9. The transporting cycle for the printed circuit boards runs as follows.

Figure 2A:
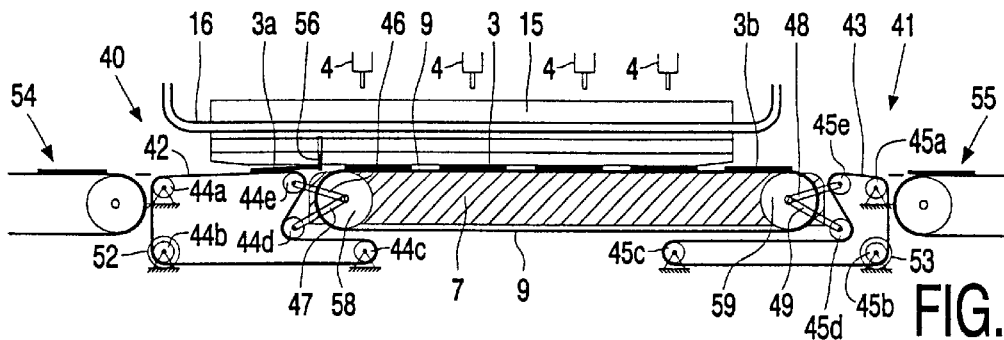
FIGS. 2a–e is a diagrammatic sequence depicting the transporting cycle of printed circuit boards in the placement machine.
Figure 2B:
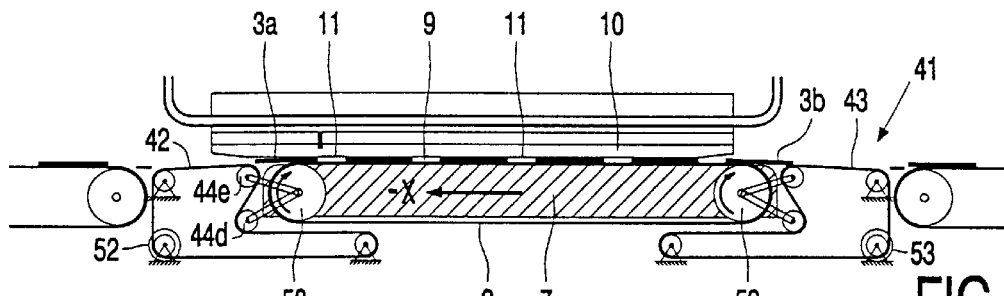
Figure 2C:
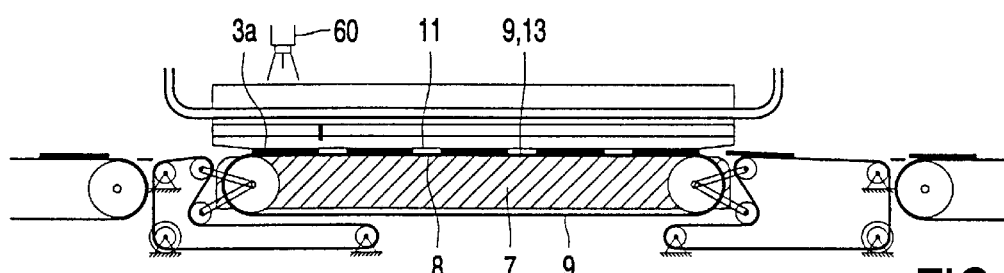
Figure 2D:
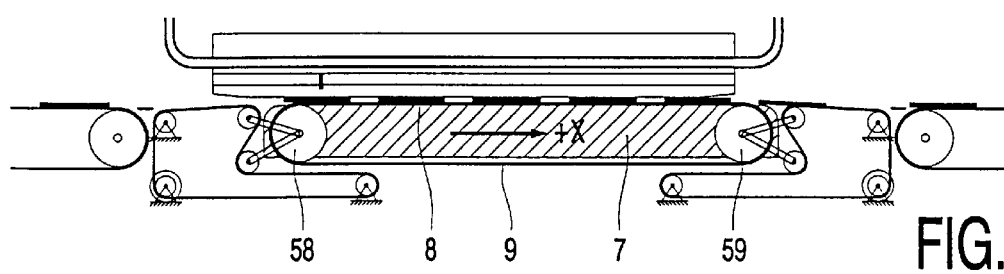
Figure 2E:
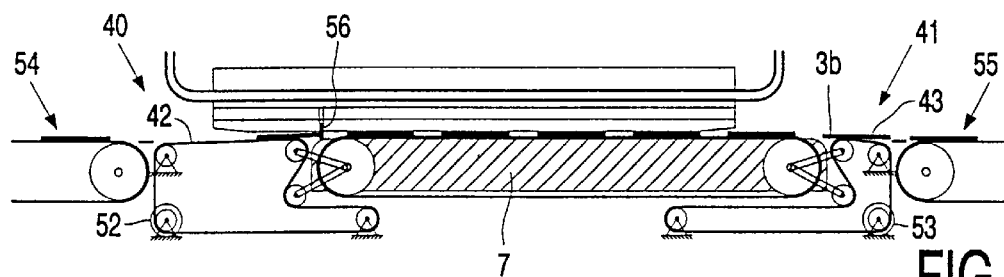

FIG. 2a shows the situation in which components are placed on the printed circuit boards 3 by placement heads 4. The motor 52 of the inlet device 40 has transported a new printed circuit board 3a up to the abutment 56. When a number of components have been placed and the printed circuit boards 3 are to be transported further, the transport belt 7 is blocked by the clamping mechanism 18. The abutment 56 is moved away so as to allow the new printed circuit board 3a to be transported into the machine. The transport beam subsequently moves to the left (see FIG. 2b), in the negative X-direction, during which the transport wheels 44d–e also move to the left. The transport wheels 58, 59 for the transport belt 9 will start rotating in clockwise direction owing to the movement of the transport beam 7. The motors 52, 53 are not driven. The transport wheels 44a–c are stationary. The movement causes the transport wheels 44d–e to rotate, and the new printed circuit board 3a rolls onto the transport belt 9. The transport belt 9 as it were rolls itself along the new printed circuit board. Although this is not shown in FIGS. 2a–e, the transport wheel 44e is pressed up by a spring in the initial phase of the movement of the transport beam to the left. The transport belt 42 is also pressed up, and accordingly also the new printed circuit board. The new printed circuit board is accordingly pressed very quickly against the contact surface 11 of the pressure beam 10. The last printed circuit board 3b in the row is rolled from the machine onto the transport belt 43 of the outlet device 41 in a corresponding manner. FIG. 3c shows the situation in which the transport beam 7 has reached its extreme position in which the new printed circuit board 3a has rolled into the correct position on the transport belt 9 and has arrived fully between the contact surface 11 of the pressure beam 10 and the outer surface 13 of the transport belt 9 (as is also depicted in FIG. 1). Since the new printed circuit board has occupied a fixed position on the transport belt in this situation, a camera 60 is already capable of determining the relative position of the printed circuit board on the transport belt with respect to the frame at this moment, which can be laid down in a computer. This is necessary if the components are to be placed on the printed circuit board in the correct positions later on. In the next step (see FIG. 2d), the transport belt 9 is released by the clamping mechanism 18 (see FIG. 1). The transport wheels 58, 59 remain stationary because the transport belt 9 has a sufficient friction in contact with the support surface 8 of the transport beam 7. The transport beam 7 now moves to the right, in the positive X-direction. The printed circuit boards remain in their positions on the transport belt 9 during this movement. The printed circuit boards are indexed one printed circuit board position further to the right. FIG. 2e shows how the transport beam 7 has reached its end position again. This position is equal to the one in FIG. 2a. The abutment 56 will resume its blocking position, and the motors 52 and 53 of the inlet and outlet devices 40, 41 are started, as are the feeder and delivery belts 54, 55, so as to roll a new printed circuit board onto the transport belt 42 again and to roll the last printed circuit board 3b from the transport belt 43.

What is claimed is:

1. A component placement machine with a frame (1) and a transport device (2) for transporting printed circuit boards (3) in an X-direction, which transport device comprising:

a transport beam (7) which extends in the X-direction and moves reciprocally in the X-direction, and a transport belt (9) which is at least partly supported by the transport beam (7), which is displaceable in the X-direction by means of the transport beam (7), and which has an outer surface (13) which supports printed circuit boards (3) during operation, further characterized in that the frame (1) is provided with a contact surface (11) which extends in the X-direction to enclose the printed circuit board (3) extending in the X-direction between the outer surface (13) of the transport belt (9) and the contact surface (11) of the frame (1), while said contact surface (11) of the frame (1) has a comparatively low friction coefficient with respect to the edge portion (12) of the printed circuit board (3), characterized in that the contact surface (11) of the frame (1) is a surface of a pressure beam (10) which is movable relative to the frame (1) in the direction of the transport belt (9), and in that means (16, 17) are present for moving the pressure beam (10) to the transport belt (9) so as to press the contact surface (11) against the edge portion (12) of the printed circuit board (3).

2. A component placement machine as claimed in claim 1, characterized in that said means comprise an inflatable air hose (16).

3. A component placement machine as claimed in claim 1, characterized in that said means comprise a resilient element (17).

4. A component placement machine with a frame (1) and a transport device (2) for transporting printed circuit boards (3) in an X-direction, which transport device comprising:

a transport beam (7) which extends in the X-direction and moves reciprocally in the X-direction, and a transport belt (9) which is at least partly supported by the transport beam (7), which is displaceable in the X-direction by means of the transport beam (7), and which has an outer surface (13) which supports printed circuit boards (3) during operation, further characterized in that the frame (1) is provided with a contact surface (11) which extends in the X-direction to enclose the printed circuit board (3) extending in the X-direction between the outer surface (13) of the transport belt (9) and the contact surface (11) of the frame (1), while said contact surface (11) of the frame (1) has a comparatively low friction coefficient with respect to the edge portion (12) of the printed circuit board (3), characterized in that the frame (1) is provided with a clamping mechanism (18) for preventing that portion of the transport belt (9) which supports the printed circuit boards (3) from moving relative to the frame (1).

5. A component placement machine as claimed in claim 4, characterized in that the clamping mechanism (18) comprises two clamping jaws (19, 20) and means (23) for moving said clamping jaws (19, 20) with respect to one another for the purpose of clamping the transport belt (9) between the clamping jaws or releasing the transport belt.

6. A component placement machine as claimed in claim 4, characterized in that the transport beam (7) is provided with air supply means (26) for creating an air bearing between the transport beam (7) and the transport belt (9) while the transport belt is being clamped by the clamping mechanism (18) and the transport beam (7) is being displaced in the X-direction.

7. A component placement machine with a frame (1) and a transport device (2) for transporting printed circuit boards (3) in an X-direction, which transport device comprising:

a transport beam (7) which extends in the X-direction and moves reciprocally in the X-direction, and a transport belt (9) which is at least partly supported by the transport beam (7), which is displaceable in the X-direction by means of the transport beam (7), and which has an outer surface (13) which supports printed circuit boards (3) during operation, further characterized in that the frame (1) is provided with a contact surface (11) which extends in the X-direction to enclose the printed circuit board (3) extending in the X-direction between the outer surface (13) of the transport belt (9) and the contact surface (11) of the frame (1), while said contact surface (11) of the frame (1) has a comparatively low friction coefficient with respect to the edge portion (12) of the printed circuit board (3), characterized in that an inlet and an outlet device (40, 41) are present for feeding printed circuit boards (3) onto the transport belt (9) and removing printed circuit boards (3) from the transport belt (9), which two devices each comprise a transport belt (42, 43) running over transport wheels (44a–e, 45a–e), at least one transport wheel (44e, 45e) being movable in the X-direction under the influence of the reciprocating movement of the transport beam (7).

\* \* \* \* \*